(12) United States Patent
Kishiyama (10) Patent No.: US 8,018,783 B2
(45) Date of Patent: Sep. 13, 2011

(54) STORAGE CIRCUIT AND STORAGE METHOD

(75) Inventor: Yoshihiro Kishiyama, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/585,564

(22) Filed: Sep. 17, 2009
(Under 37 CFR 1.47)

(65) Prior Publication Data
US 2010/0259997 A1    Oct. 14, 2010

Related U.S. Application Data

(63) Continuation of application No. PCT/JP2007/055511, filed on Mar. 19, 2007.

(51) Int. Cl.
*G11C 7/10* (2006.01)
(52) U.S. Cl. .................................. 365/189.05; 365/205
(58) Field of Classification Search ............. 365/189.05, 365/205
See application file for complete search history.

(56) References Cited

U.S. PATENT DOCUMENTS

| | | | |
|---|---|---|---|
| 5,103,117 A | 4/1992 | Voorman et al. | |
| 5,170,074 A | 12/1992 | Aoki | |
| 5,376,836 A | 12/1994 | Tago | |
| 5,497,115 A * | 3/1996 | Millar et al. ................. | 327/211 |
| 6,700,412 B2 | 3/2004 | Takahashi | |

FOREIGN PATENT DOCUMENTS

| | | |
|---|---|---|
| JP | 3-262317 | 11/1991 |
| JP | 6-85621 | 3/1994 |
| JP | 3137680 | 12/2000 |
| JP | 2002-135109 | 5/2002 |
| JP | 2006-41760 | 2/2006 |

OTHER PUBLICATIONS

International Search Report for PCT/JP2007/055511, mailed May 15, 2007.

* cited by examiner

*Primary Examiner* — Michael T Tran
(74) *Attorney, Agent, or Firm* — Staas & Halsey LLP (57) ABSTRACT

A storage circuit includes a first switching unit that receives data and is controlled to switch between an electrically connecting state and an electrically disconnecting state according to a clock signal input to a gate terminal of the first switching unit, an inverting unit that inverts the data and outputs the inverted data, a second switching unit that receives the inverted data and is controlled simultaneously with the first switching unit to switch between the electrically connecting state and the electrically disconnecting state according to the clock signal input to a gate terminal of the second switching unit and a latching unit that is connected to an output terminal of the first switching unit and an output terminal of the second switching unit, latches the data and the inverted data, and outputs the data and the inverted data simultaneously.

7 Claims, 7 Drawing Sheets

STORAGE CIRCUIT AND STORAGE METHOD

CROSS-REFERENCE TO RELATED APPLICATION(S)

This application is a continuation of PCT international application Ser. No. PCT/JP2007/055511 filed on Mar. 19, 2007 which designates the United States, the entire contents of which are incorporated herein by reference.

FIELD

The embodiments discussed herein are directed to a storage circuit and a storage method.

BACKGROUND

In general, latch circuits are used for holding and storing input signals. Latch circuits are formed of, for example, metal oxide semiconductor (MOS) transistors that switch between an electrically connecting state (hereinafter, "ON-state") and an electrically disconnecting state (hereinafter, "OFF-state") according to inverters that invert input signals or gate voltage. In recent years, as disclosed in, for example, Japanese Laid-open Patent Publication No. 2006-41760, latching of an optical signal obtained by a photodiode has been proposed, which uses a latch circuit having a small mounting area.

Figure 6:
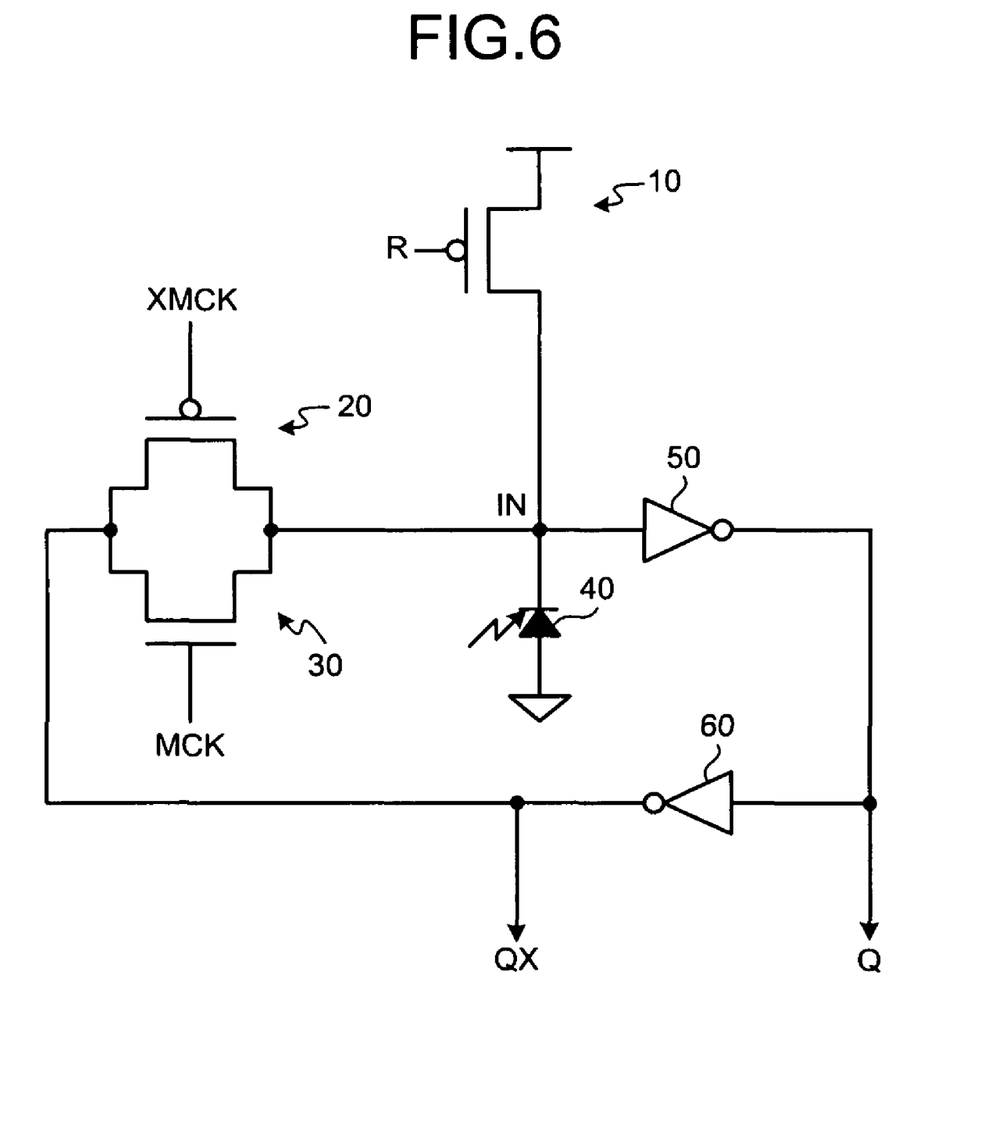
FIG. 6 is a circuit diagram illustrating an example of a configuration of a conventional latch circuit.

FIG. 6 is a circuit diagram of a configuration of the latch circuit disclosed in the above Publication. In this latch circuit, the optical signal input to a photodiode 40 is latched by a loop including an inverter 50 and an inverter 60.

More particularly, while a gate formed of a P-channel MOS transistor 20 and an N-channel MOS transistor 30 is in the OFF-state according to a gate signal MCK and an inverted gate signal XMCK, a refresh signal R changes to "0" level to switch a P-channel MOS transistor 10 into the ON-state. Accordingly, a positive power supply voltage is continuously applied to an input terminal IN and the photodiode 40 to accumulate electric charge in a capacitor of the photodiode 40, until the refresh signal R changes to "1" level to switch the P-channel MOS transistor 10 into the OFF-state.

If an optical signal is input to the photodiode 40 after the refresh signal R changes to "1" level, the photodiode 40 switches into the ON-state, the electric charge accumulated in the capacitor is discharged, and the voltage of the input terminal IN changes to "0" level. As this happens, an output Q obtained as a result of inverting an input voltage by the inverter 50 is at "1" level, and an inverted output QX obtained as a result of inverting the output Q by the inverter 60 is at "0" level.

Subsequently, when the gate signal MCK and the inverted gate signal XMCK are inverted and the gate formed of the P-channel MOS transistor 20 and the N-channel MOS transistor 30 switches into the ON-state, the loop including the inverter 50 and the inverter 60 functions as the latch circuit to latch the optical signal input to the photodiode 40 stably.

However, in the conventional latch circuits, output timings of an output and an inverted output differ from each other. For example, in the latch circuit disclosed in the above Publication, because the inverted output QX is obtained by inverting the output Q by the inverter 60, an output timing of the inverted output QX is delayed by a time taken by the inverter 60 to perform the inversion.

Figure 7:
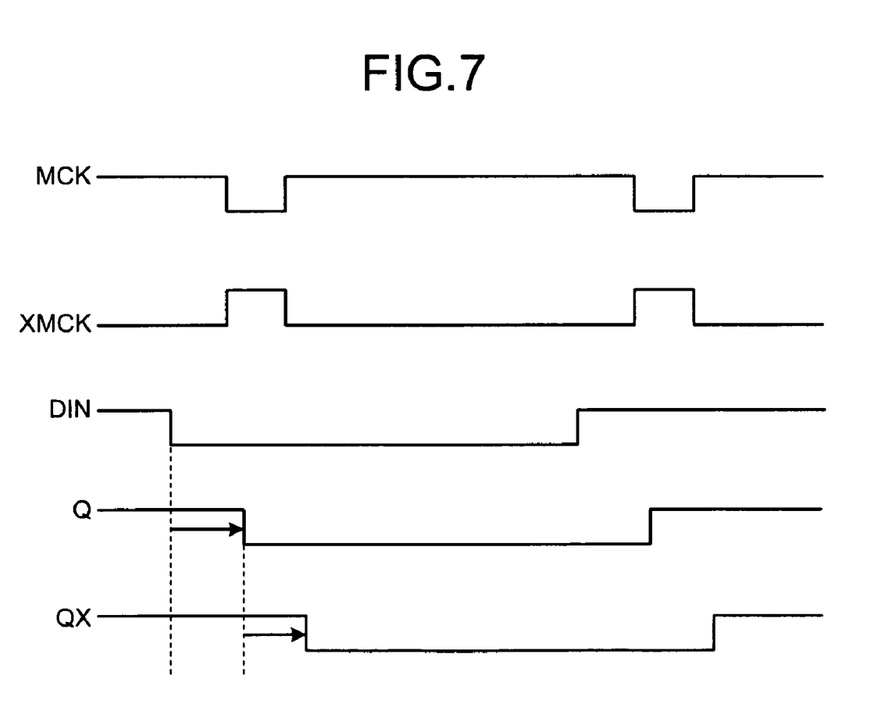
FIG. 7 is a timing chart indicating an example of output timings of signals.

More particularly, as illustrated in FIG. 7, when latching an input signal DIN, the input signal DIN is input when the gate signal MCK is at "0" level (i.e., when the inverted gate signal XMCK is at "1" level), and while the gate signal MCK is at "1" level (i.e., while the inverted gate signal XMCK is at "0" level), the latched input signal DIN is output as the output Q and as the inverted output QX. The output timing of this output Q is delayed from the output timing of the input signal DIN at least by a time taken by the inverter 50 to perform the inversion. Further, the output timing of this inverted output QX is delayed from the output timing of the output Q by a time taken by the inverter 60 to perform the inversion. As a result, the output timings of the output Q and the inverted output QX do not coincide with each other.

If such a latch circuit is used for, for example, a random access memory (RAM), a time difference may be generated between an output of a write signal and an output of a read signal, which have an inversion relation to each other. As a result, writing and reading may be performed at the same time, or both writing and reading may not be performed, resulting in the RAM not operating normally.

SUMMARY

According to an aspect of the invention a storage circuit includes a first switching unit that receives data and is controlled to switch between an electrically connecting state and an electrically disconnecting state according to a clock signal input to a gate terminal of the first switching unit, an inverting unit that inverts the data and outputs the inverted data, a second switching unit that receives the inverted data and is controlled simultaneously with the first switching unit to switch between the electrically connecting state and the electrically disconnecting state according to the clock signal input to a gate terminal of the second switching unit and a latching unit that is connected to an output terminal of the first switching unit and an output terminal of the second switching unit, latches the data and the inverted data, and outputs the data and the inverted data simultaneously.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of the present invention will be explained with reference to the accompanying drawings. In the following explanation, a P-channel MOS transistor is simply referred to as "a PMOS", and an N-channel MOS transistor is simply referred to as "an NMOS".

Figure 1:
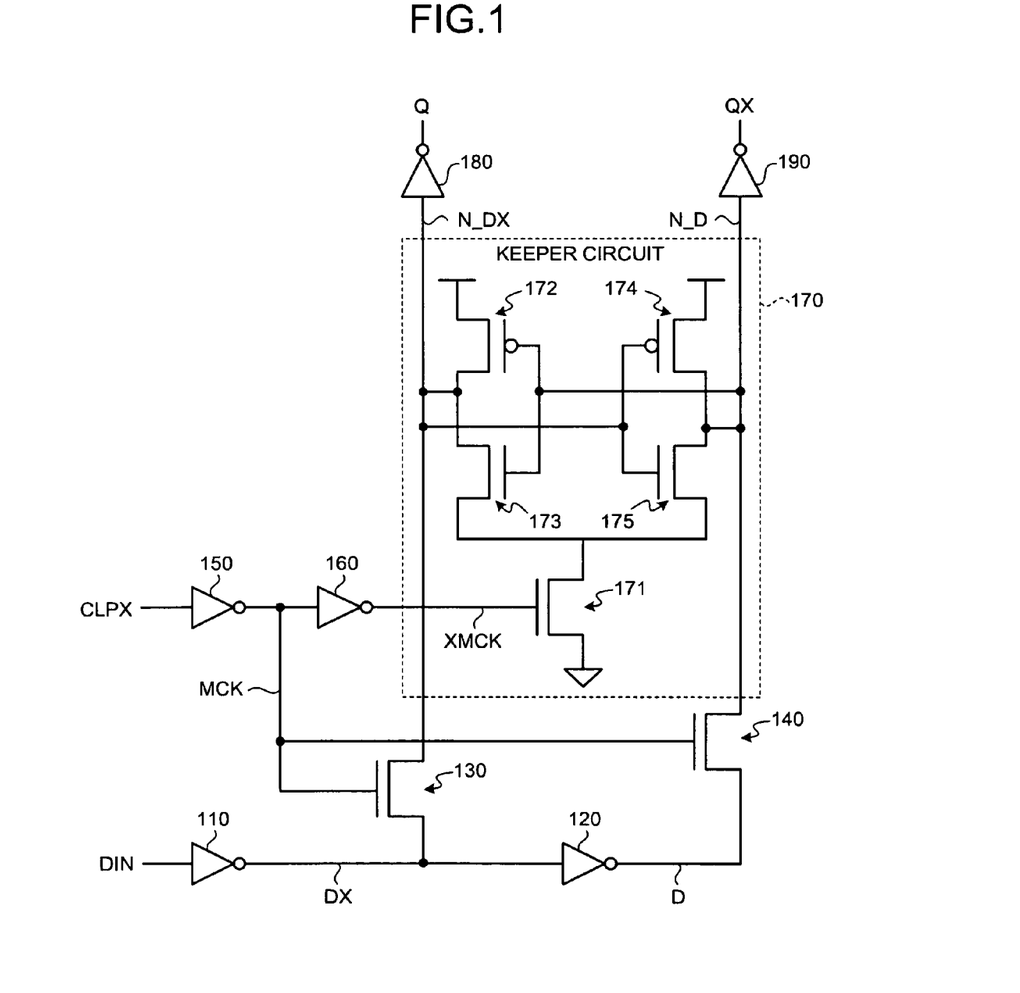
FIG. 1 is a circuit diagram illustrating a configuration of a latch circuit according to an embodiment of the present invention.

FIG. 1 is a circuit diagram illustrating a configuration of a latch circuit according to an embodiment of the present invention. The latch circuit illustrated in FIG. 1 includes an inverter 110, an inverter 120, an NMOS 130, an NMOS 140, an inverter 150, an inverter 160, a keeper circuit 170, an inverter 180, and an inverter 190.

The inverter 110 inverts an input signal DIN and outputs the inverted data DX. More particularly, the inverter 110 outputs the inverted data DX at "0" level when the input signal DIN is at "1" level, and outputs the inverted data DX at "1" level when the input signal DIN is at "0" level.

The inverter 120 inverts the inverted data DX and outputs data D equal to the input signal DIN. More particularly, the inverter 120 outputs the data D at "0" level when the inverted data DX is at "1" level, and outputs the data D at "1" level when the inverted data DX is at "0" level.

The NMOS 130 is a pass transistor that switches between the ON-state and the OFF-state according to a gate signal MCK that originates from a clock signal CLPX and that is input to a gate terminal of the NMOS 130, and controls supply of the inverted data DX to the keeper circuit 170. More particularly, the NMOS 130 is in the ON-state when the gate signal MCK is at "1" level. In the ON-state, the NMOS 130 supplies the inverted data DX to the keeper circuit 170. The NMOS 130 is in the OFF-state when the gate signal MCK is at "0" level. In the OFF-state, the NMOS 130 does not supply the inverted data DX to the keeper circuit 170.

The NMOS 140 is a pass transistor that switches between the ON-state and the OFF-state according to the gate signal MCK that originates from the clock signal CLPX and that is input to a gate terminal of the NMOS 140. The NMOS 140 controls supply of the data D to the keeper circuit 170. More particularly, the NMOS 140 is in the ON-state when the gate signal MCK is at "1" level, and supplies the data D to the keeper circuit 170. The NMOS 140 is in the OFF-state when the gate signal MCK is at "0" level. In the OFF-state, the NMOS 140 does not supply the data D to the keeper circuit 170.

The NMOS 130 and the NMOS 140 control the supply of the inverted data DX and the data D both originating from the input signal DIN to the keeper circuit 170. More particularly, while the NMOS 130 and the NMOS 140 are in the OFF-state, the inverted data DX and the data D are latched by the keeper circuit 170.

The inverter 150 inverts the clock signal CLPX and outputs the gate signal MCK. More particularly, the inverter 150 outputs the gate signal MCK at "0" level when the clock signal CLPX is at "1" level, and outputs the gate signal MCK at "1" level when the clock signal CLPX is at "0" level.

The inverter 160 inverts the gate signal MCK and outputs the inverted gate signal XMCK equal to the clock signal CLPX. More particularly, the inverter 160 outputs the inverted gate signal XMCK at "0" level when the gate signal MCK is at "1" level, and outputs the inverted gate signal XMCK at "1" level when the gate signal MCK is at "0" level.

The keeper circuit 170 latches the inverted data DX and the data D, and outputs the latched inverted data N_DX equal to the inverted data DX and the latched data N_D equal to the data D at the same timing while the NMOS 130 and the NMOS 140 are in the OFF-state. A particular internal configuration of the keeper circuit 170 will be described in detail later.

The inverter 180 inverts the latched inverted data N_DX and outputs output data Q equal to the input signal DIN. More particularly, the inverter 180 outputs the output data Q at "0" level when the latched inverted data N_DX is at "1" level, and outputs the output data Q at "1" level when the latched inverted data N_DX is at "0" level.

The inverter 190 inverts the latched data N_D and outputs inverted output data QX equal to an inverted signal of the input signal DIN. More particularly, the inverter 190 outputs the inverted output data QX at "0" level when the latched data N_D is at "1" level, and outputs the inverted output data QX at "1" level when the latched data N_D is at "0" level.

In the present embodiment, the inverter 110, the inverter 150, the inverter 180, and the inverter 190 are provided at input terminals and output terminals for signals to stabilize operation of the latch circuit. However, the latch circuit may be configured without a part or all of these inverters. In this case, polarity of a signal is inverted at each location. The latch circuit preferably includes the inverter 120 and the inverter 160 to obtain the data D, the inverted data DX, the gate signal MCK, and the inverted gate signal XMCK.

The internal configuration of the keeper circuit 170 is described below. The keeper circuit 170 according to the embodiment includes an NMOS 171, a PMOS 172, an NMOS 173, a PMOS 174, and an NMOS 175.

The NMOS 171 is a pass transistor that switches between the ON-state and the OFF-state according to the inverted gate signal XMCK originating from the clock signal CLPX input to a gate terminal of the NMOS 171, and controls application of ground voltage to the NMOS 173 and the NMOS 175. More particularly, the NMOS 171 is in the ON-state when the inverted gate signal XMCK is at "1" level to apply the ground voltage to source terminals of the NMOS 173 and the NMOS 175. Accordingly, when the NMOS 173 and the NMOS 175 are in the ON-state, signals at "0" level are output from drain terminals thereof as the latched inverted data N_DX and the latched data N_D.

The inverted gate signal XMCK is input to the gate terminal of the NMOS 171. Therefore, when both of the NMOS 130 and the NMOS 140, to which the gate signal MCK is input to the gate terminals thereof, are in the ON-state, the NMOS 171 is in the OFF-state, and, when the NMOS 130 and the NMOS 140 are in the OFF-state, the NMOS 171 is in the ON-state. In other words, while the NMOS 130 and the NMOS 140 are in the OFF-state and thus a new input signal DIN is not supplied to the keeper circuit 170, the NMOS 171 is in the ON-state to allow the keeper circuit 170 to function as a latch circuit.

The PMOS 172 switches between the ON-state and the OFF-state depending on the data D input to a gate terminal of the PMOS 172. When the PMOS 172 is in the ON-state, the PMOS 172 outputs a signal at "1" level from a drain terminal thereof. More particularly, the PMOS 172 is in the ON-state when the data D is at "0" level, and outputs a signal at "1" level as the latched inverted data N_DX from the drain terminal of the PMOS 172 by using a positive power supply voltage connected to a source terminal of the PMOS 172.

The NMOS 173 switches between the ON-state and the OFF-state depending on the data D input to a gate terminal of the NMOS 173. When both the NMOS 173 and the NMOS 171 are in the ON-state, the NMOS 173 outputs a signal at "0" level from the drain terminal of the NMOS 173. More particularly, the NMOS 173 is in the ON-state when the data D is at "1" level, and when the NMOS 171 is also in the ON-state, the NMOS 173 outputs a signal at "0" level as the latched inverted data N_DX from the drain terminal of the NMOS 173 by using the ground voltage connected to the source terminal of the NMOS 173.

The PMOS 172 and the NMOS 173 form an inverter circuit that receives the data D as an input and outputs the latched inverted data N_DX as an output. In other words, when the NMOS 171 is in the ON-state, the keeper circuit 170 outputs a signal at "0" level as the latched inverted data N_DX when the data D is at "1" level, and the keeper circuit 170 outputs a signal at "1" level as the latched inverted data N_DX when the data D is at "0" level.

The PMOS 174 switches between the ON-state and the OFF-state depending on the inverted data DX input to a gate terminal of the PMOS 174. When the PMOS 174 is in the ON-state, the PMOS 174 outputs a signal at "1" level from a drain terminal of the PMOS 174. More particularly, the PMOS 174 is in the ON-state when the inverted data DX is at "0" level, and outputs a signal at "1" level as the latched data N_D from the drain terminal of the PMOS 174 by using a positive power supply voltage connected to a source terminal of the PMOS 174.

The NMOS 175 switches between the ON-state and the OFF-state depending on the inverted data DX input to a gate terminal of the NMOS 175. When both the NMOS 175 and the NMOS 171 are in the ON-state, the NMOS 175 outputs a signal at "0" level from the drain terminal of the NMOS 175. More particularly, the NMOS 175 is in the ON-state when the inverted data DX is at "1" level, and when the NMOS 171 is also in the ON-state, the NMOS 175 outputs a signal at "0" level as the latched data N_D from the drain terminal of the NMOS 175 by using the ground voltage connected to the source terminal of the NMOS 175.

The PMOS 174 and the NMOS 175 form an inverter circuit that receives the inverted data DX as an input and outputs the latched data N_D as an output. In other words, when the NMOS 171 is in the ON-state, the keeper circuit 170 outputs a signal at "0" level as the latched data N_D when the inverted data DX is at "1" level, and the keeper circuit 170 outputs a signal at "1" level as the latched data N_D when the inverted data DX is at "0" level.

The inverter circuit including the PMOS 172 and the NMOS 173 and the inverter circuit including the PMOS 174 and the NMOS 175 are connected to each other to form a loop with an input terminal of one of the inverter circuits connected to an output terminal of the other one of the inverter circuits and an output terminal of the one of the inverter circuits connected to an input terminal of the other one of the inverter circuits. Therefore, the keeper circuit 170 is able to infallibly latch the data D and the inverted data DX while the NMOS 130 and the NMOS 140 are in the OFF-state.

Figure 2:
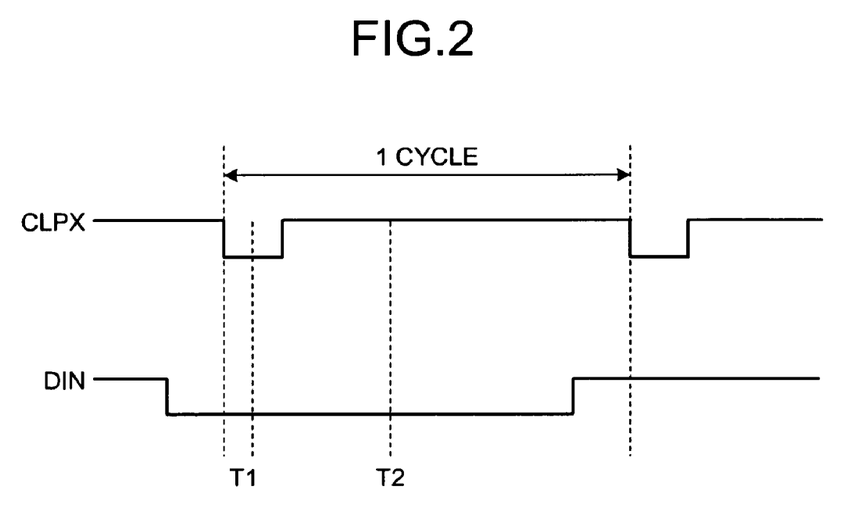
FIG. 2 is a timing chart of an example of a clock signal and an input signal.

Operation of the latch circuit according to the embodiment is described below. In the embodiment, as illustrated in FIG. 2, the clock signal CLPX changes to "0" level in a predetermined cycle. As the clock signal CLPX changes to "0" level, the input signal DIN is input. In the following description, operation of the latch circuit at time T1 at which the clock signal CLPX is at "0" level and at time T2 at which the clock signal CLPX is at "1" level is explained assuming that the input signal DIN at "0" level is input.

Figure 3:
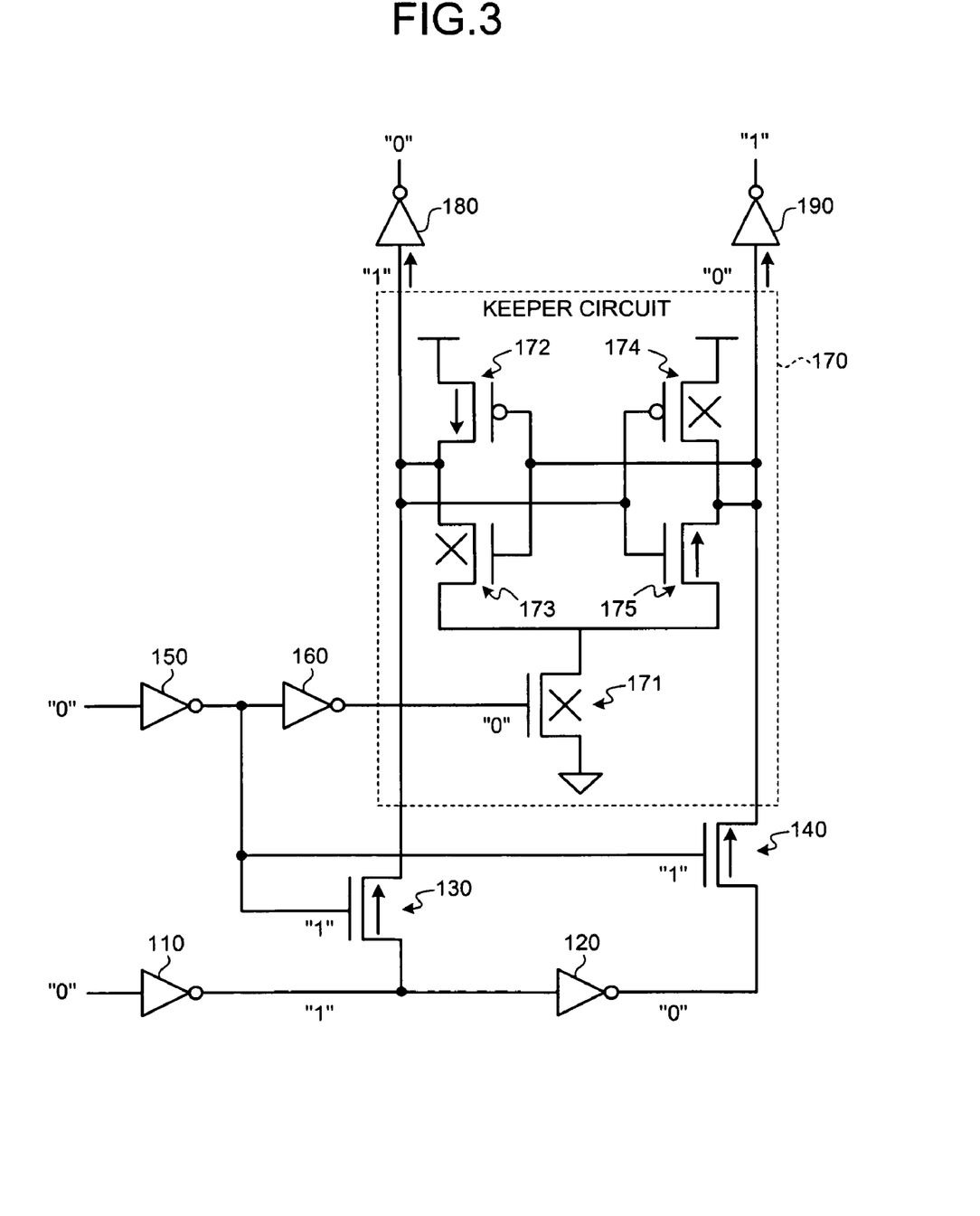
FIG. 3 is a circuit diagram of a state of the latch circuit at time T1.

FIG. 3 is a circuit diagram indicating ON/OFF states of the MOS transistors and signal levels at the time T1 when the clock signal CLPX is at "0" level.

At the time T1, because the clock signal CLPX is at "0" level, the gate signal MCK obtained as a result of inverting the clock signal CLPX by the inverter 150 is at "1" level. Therefore, the gate signal MCK at "1" level is input to the gate terminals of the NMOS 130 and the NMOS 140 and the NMOS 130 and the NMOS 140 switches into the ON-state.

At the same time, the inverted gate signal XMCK obtained as a result of inverting the gate signal MCK by the inverter 160 is at "0" level, and is input to the gate terminal of the NMOS 171. Therefore, the NMOS 171 switches into the OFF-state. The keeper circuit 170 thus does not function while the clock signal CLPX is at "0" level.

On the other hand, because the input signal DIN is at "0" level, the inverted data DX obtained through the inverter 110 is at "1" level, and the data D obtained through the inverter 120 is at "0" level. The level of the inverted data DX has been fixed at "1" level and the level of the data D has been fixed at "0" level before the NMOS 130 and the NMOS 140 switches into the ON-state as a result of receiving the gate signal MCK of "1" level. When the NMOS 130 and the NMOS 140 switch into the ON-state, the inverted data DX is output as the latched inverted data N_DX via the NMOS 130 and the keeper circuit 170, and the data D is output as the latched data N_D via the NMOS 140 and the keeper circuit 170. In other words, the keeper circuit 170 outputs the latched inverted data N_DX at "1"level and the latched data N_D at "0" level.

The latched inverted data N_DX is inverted by the inverter 180 and the latched data N_D is inverted by the inverter 190, and the output data Q at "0" level equal to the input signal DIN and the inverted output data QX at "1" level equal to the inverted signal of the input signal DIN are output simultaneously. Thus, when the clock signal CLPX is at "0" level, the output data Q equal to the input signal DIN and the inverted output data QX equal to the inverted signal of the input signal DIN are output at the same timing.

Figure 4:
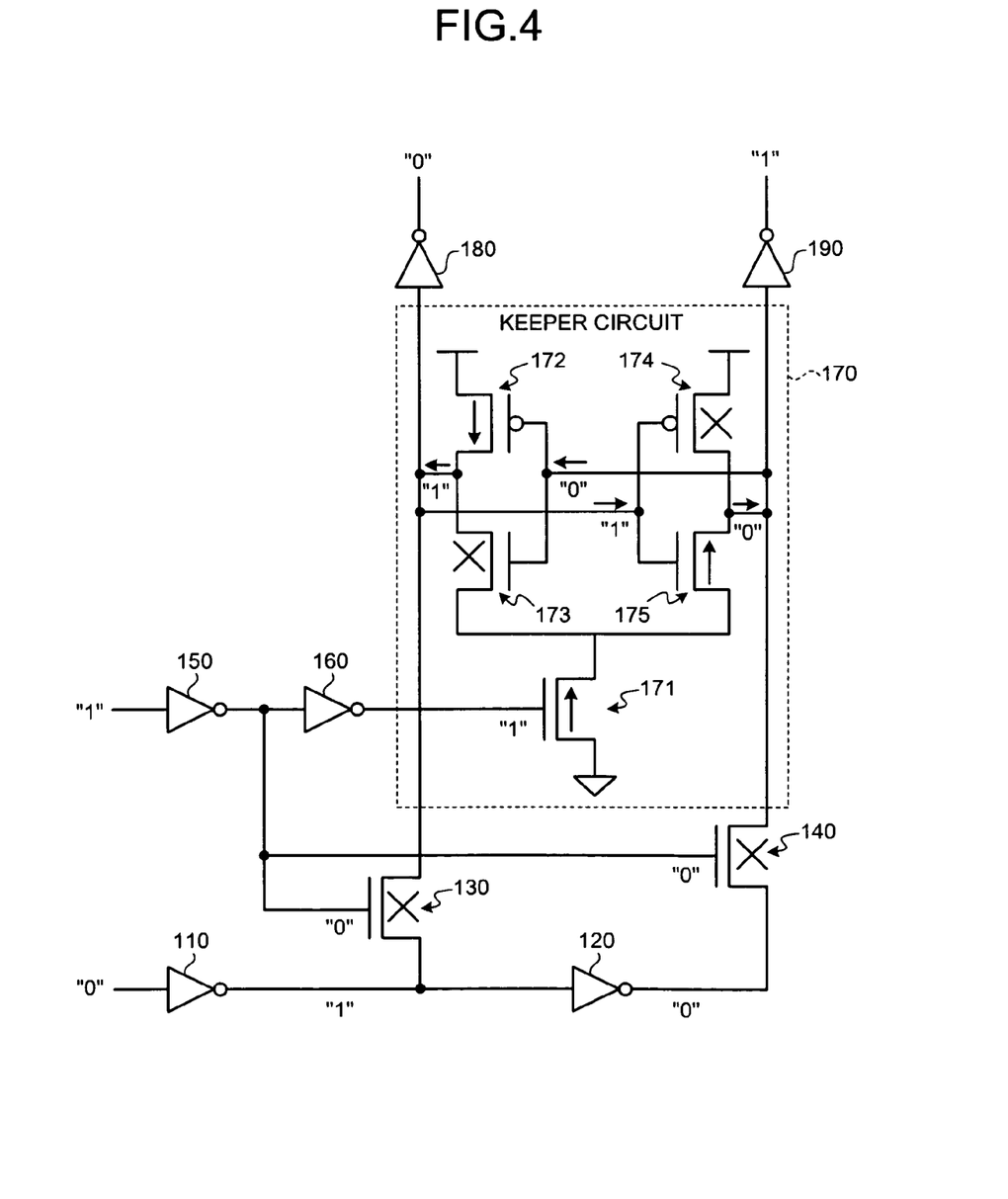
FIG. 4 is a circuit diagram of a state of the latch circuit at time T2.

FIG. 4 is a circuit diagram indicating the ON/OFF states of the MOS transistors and signal levels at the time T2 at which the clock signal CLPX is at "1" level.

At the time T2, because the clock signal CLPX is at "1" level, the gate signal MCK obtained as a result of inverting the clock signal CLPX by the inverter 150 is at "0" level. Therefore, the gate signal MCK at "0" level is input to the gate terminals of the NMOS 130 and the NMOS 140, and the NMOS 130 and the NMOS 140 switches into the OFF-state.

At the same time, the inverted gate signal XMCK obtained as a result of inverting the gate signal MCK by the inverter 160 is at "1" level, and is input to the gate terminal of the NMOS 171, to switch the NMOS 171 into the ON-state. Therefore, the keeper circuit 170 outputs the latched signals while the clock signal CLPX is at "1" level.

More particularly, since the data D at "0" level has been input as an input to the inverter circuit including the PMOS 172 and the NMOS 173, the PMOS 172 switches into the ON-state, while the NMOS 173 switches into the OFF-state. Therefore, the PMOS 172 connected to the positive power supply voltage outputs a signal at "1" level as the latched inverted data N_DX and an input to the inverter circuit including the PMOS 174 and the NMOS 175 are held at "1" level.

Similarly, since the inverted data DX at "1"level has been input as an input to the inverter circuit including the PMOS 174 and the NMOS 175, the NMOS 175 switches into the ON-state, while the PMOS 174 switches into the OFF-state. Therefore, the NMOS 175 connected to the ground voltage via the NMOS 171 outputs a signal at "0"level as the latched data ND, and an input to the inverter circuit including the PMOS 172 and the NMOS 173 are held at "0" level.

The latched inverted data N_DX is inverted by the inverter 180 and the latched data N_D is inverted by the inverter 190, and the output data Q at "0" level equal to the input signal DIN and the inverted output data QX at "1"level equal to the inverted signal of the input signal DIN are output simultaneously.

Thus, while the clock signal CLPX is at "1" level, the input signal DIN and the inverted signal of the input signal DIN are latched and stored by the two inverter circuits connected to each other to form a loop in the keeper circuit 170, and the output data Q and the inverted output data QX are continuously output at the same timing. The output data Q and the inverted output data QX are not changed from those obtained when the clock signal CLPX is at "0" level just before the clock signal CLPX is switched to "1" level. Thus, the input signal DIN is infallibly latched by the keeper circuit 170.

Because the input signal DIN is at "0" level, the inverted data DX obtained through the inverter 110 is at "1" level, and the data D obtained through the inverter 120 is at "0" level. However, the inverted data DX and the data D do not pass through the NMOS 130 and the NMOS 140. Therefore, even when the input signal DIN changes to "1" level, as long as the clock signal CLPX is at "1" level, the changed input signal DIN is not supplied to the keeper circuit 170.

Figure 5:
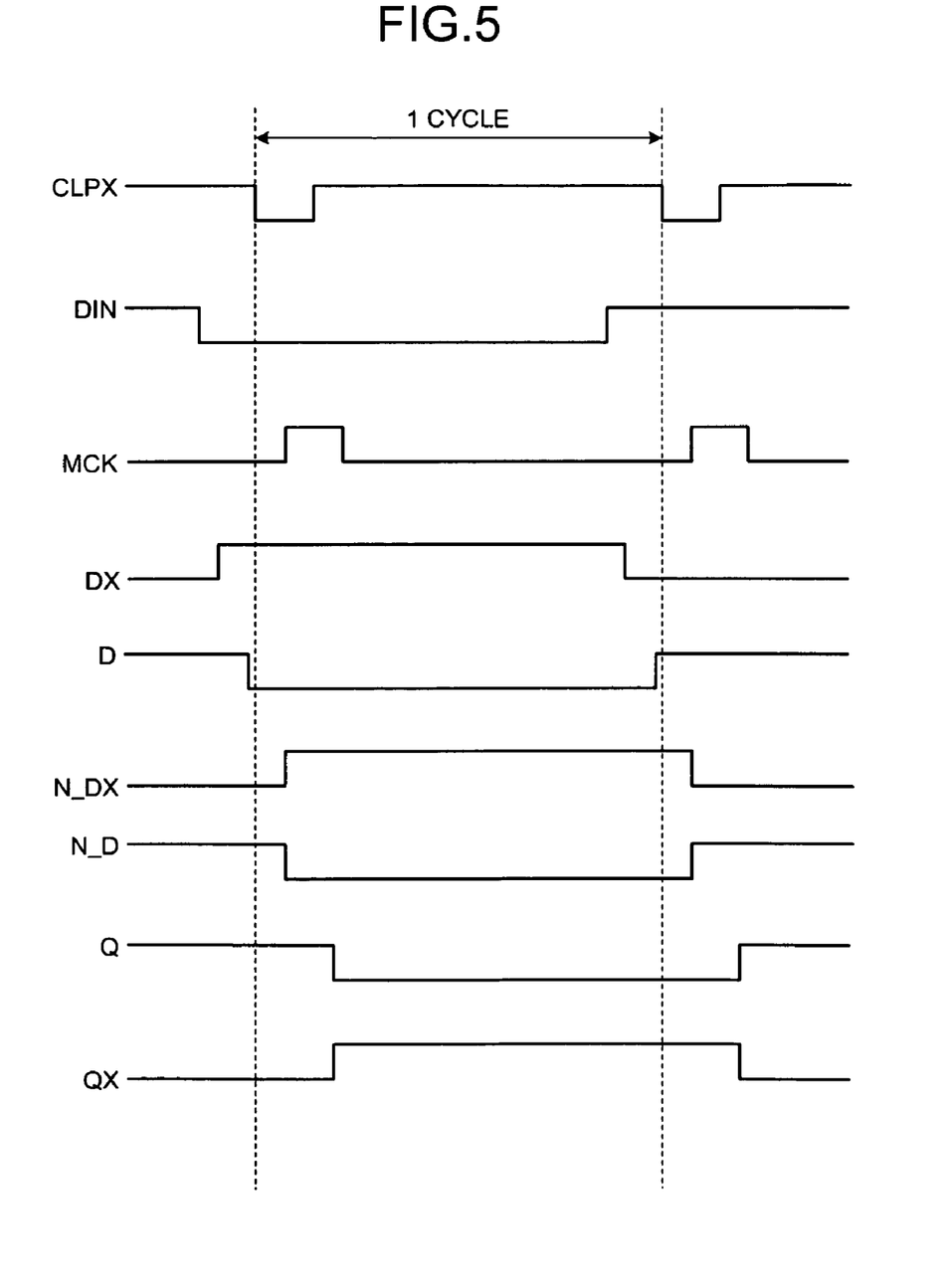
FIG. 5 is a timing chart indicating output timings of signals according to the embodiment.

Timings of changes in the signals are illustrated in FIG. 5. As described above, in the embodiment, the clock signal CLPX changes to "0" level in a predetermined cycle. When the clock signal CLPX changes to "0" level at the beginning of one cycle illustrated in FIG. 5, the gate signal MCK changes to "1" level after a delay of a time period taken by the inverter 150 to perform the inversion.

At this moment, the level of the inverted data DX has been fixed at "1" level and the level of the data D has been fixed at "0" level as a result of the input signal DIN at "0" level being input. In other words, when the input signal DIN at "0" level is input, the inverted data DX changes to "1" level after a delay of a time period taken for the inverter 110 to perform the inversion, and the data D changes to "0" level after a delay of a time period taken by the inverter 120 to perform the inversion. When the gate signal MCK changes to "1" level, the NMOS 130 and the NMOS 140 switches into the ON-state, and thus the latched inverted data N_DX output from the keeper circuit 170 changes to "1" level and the latched data ND output from the keeper circuit 170 changes to "0" level at the same time.

The latched inverted data N_DX is output as the output data Q after a delay of a time period taken by the inverter 180 to perform the inversion, while the latched data N_D is output as the inverted output data QX after a delay of a time taken by the inverter 190 to perform the inversion.

Subsequently, when the clock signal CLPX returns to "1" level, the gate signal MCK returns to "0" level. Accordingly, the NMOS 130 and the NMOS 140 switches into the OFF-state, and the signals latched by the keeper circuit 170 are continuously output as the output data Q and the inverted output data QX. Since the output data Q keeps being inverted by the inverter 180, and the inverted output data QX keeps being inverted by the inverter 190, the output timings of the output data Q and the inverted output data QX are the same. Therefore, the input signal DIN and the inverted signal of the input signal DIN are continuously output simultaneously.

As described above, according to the embodiment, a signal input at the beginning of one cycle is latched by two inverter circuits that are connected to each other to form a loop such that an input terminal of one of the inverter circuits is connected to an output terminal of the other one of the inverter circuits and an output terminal of the one of the inverter circuits is connected to an input terminal of the other one of the inverter circuits. The inverter circuits output the input signal and an inverted signal of the input signal via the output terminals thereof. Therefore, processing procedures performed on the input signal and the inverted signal before the input signal is output from the latch circuit are the same. As a result, the input signal and the inverted signal are output simultaneously. Thus, the input signal is latched and stored, and output timings of an output equal to the input signal and an inverted output obtained by inverting the input signal are the same.

In the above-described embodiment, the switching between the ON-state and OFF-state are performed by the NMOS 130, the NMOS 140, and the NMOS 171, but these pass transistors may be replaced with, for example, analog switches. If the analog switches are used, opening and closing are controlled by the clock signal CLPX to switch between the ON-state and the OFF-state.

According to an aspect of the present invention, a first switch and a second switch are provided. The first switch receives data and is controlled to switch between an ON-state and an OFF state according to a clock signal input to a gate terminal thereof. The second switch receives inverted data obtained by inverting the data and is controlled to switch between the ON-state and the OFF state at the same time as the first switching unit is controlled to switch between the ON-state and the OFF-state according to the clock signal input to a gate terminal thereof. An output terminal of the first switch and an output terminal of the second switch are connected to a latch unit, the latch unit latches the data and the inverted data, and the latch unit outputs the data and the inverted data simultaneously. Therefore, the input signal is latched and stored, and output timings of an output equal to the input signal and an inverted output obtained by inverting the input signal are the same.

Furthermore, according to another aspect of the present invention, two inverters and a third switch are provided. The two inverters receive the data and the inverted data and are connected to each other to form a loop such that an input terminal of one of the inverters is connected to an output terminal of the other one of the inverters and an output terminal of the one of the inverters is connected to an input terminal of the other one of the inverters. The third switch is commonly connected to ground terminals of the inverters, and grounds the ground terminals of the two inverters under control according to an inverted clock signal that is obtained by inverting a clock signal input to a gate terminal thereof. Therefore, the two inverters are grounded to operate when the first and second switches are in the OFF-state. As a result, the data and the inverted data are latched by the two inverters.

Moreover, according to still another aspect of the present invention, the data is acquired and output and the inverted data is output. Therefore the latched data and the latched inverted data are output simultaneously.

Furthermore, according to still another aspect of the present invention, at least one of the first, second, and third switches is formed of a pass transistor. Therefore, the first, second, and third switches switch between the ON-state and the OFF-state according to inversion of the clock signal.

Moreover, according to still another aspect of the present invention, one of a source terminal and a drain terminal of the pass transistor functions as an input terminal, and the other one of the source terminal and the drain terminal functions as an output terminal. Therefore, the ON-state and the OFF-state are infallibly switched by inputting a clock signal to a gate terminal.

Furthermore, according to still another aspect of the present invention, the inverter outputs the data and the inverted data, so the operation of the circuit is stabilized.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A storage circuit comprising:
a first switching unit that receives data and is controlled to switch between an electrically connecting state and an electrically disconnecting state according to a clock signal input to a gate terminal of the first switching unit;
an inverting unit that inverts the data and outputs the inverted data;
a second switching unit that receives the inverted data and is controlled simultaneously with the first switching unit to switch between the electrically connecting state and the electrically disconnecting state according to the clock signal input to a gate terminal of the second switching unit; and
a latching unit that is connected to an output terminal of the first switching unit and an output terminal of the second switching unit, latches the data and the inverted data, and outputs the data and the inverted data simultaneously, wherein the latching unit includes
two inverters that receive the data and the inverted data and are connected to each other to form a loop such that an input terminal of one of the inverters is connected to an output terminal of other one of the inverters and an output terminal of the one of the inverters is connected to an input terminal of the other one of the inverters, and
a third switching unit that is commonly connected to ground terminals of the inverters, and grounds the ground terminals based on an inverted clock signal that is obtained by inverting the clock signal and that is input to a gate terminal of the third switching unit.

2. A storage circuit comprising:
a first switching unit that receives data by being controlled to switch between an electrically connecting state and an electrically disconnecting state according to a clock signal input to a gate terminal of the first switching unit;
an inverting unit that inverts the data and outputs the inverted data;
a second switching unit that receives the inverted data simultaneously with the reception of the data by the first switching unit, by being controlled to switch between the electrically connecting state and the electrically disconnecting state according to the clock signal input to a gate terminal of the second switching unit;
a latching unit that is connected to an output terminal of the first switching unit and an output terminal of the second switching unit, and latches the data and the inverted data;
a first output unit that outputs the data latched by the latching unit; and
a second output unit that outputs the inverted data latched by the latching unit, simultaneously with the output of the data by the first output unit.

3. The storage circuit according to claim 2, wherein the latching unit includes
two inverters that receive the data and the inverted data and are connected to each other to form a loop such that an input terminal of one of the inverters is connected to an output terminal of other one of the inverters and an output terminal of the one of the inverters is connected to an input terminal of the other one of the inverters, and
a third switching unit that is commonly connected to ground terminals of the inverters, and grounds the ground terminals based on an inverted clock signal that is obtained by inverting the clock signal and that is input to a gate terminal of the third switching unit.

4. The storage circuit according to claim 3, wherein at least one of the first, second, and third switching units is formed of a pass transistor.

5. The storage circuit according to claim 4, wherein one of a source terminal and a drain terminal of the pass transistor is an input terminal and other one of the source terminal and the drain terminal is an output terminal.

6. The storage circuit according to claim 2, wherein at least one of the first and the second output units is formed of an inverter.

7. A method of storing data in a keeper circuit including a first inverter and a second inverter that are connected to each other to form a loop, the method comprising:
inputting the data and inverted data that is obtained by inverting the data to the keeper circuit simultaneously based on a clock signal;
latching the data and the inverted data by the first inverter and the second inverter being alternately driven; and
outputting the data latched by the keeper from a first output unit and outputting the inverted data latched by the keeper circuit from a second output unit simultaneously with the output of the data from the first output unit.

* * * * *